United States Patent [19]

Fisch

[11] Patent Number: 5,254,482
[45] Date of Patent: Oct. 19, 1993

[54] FERROELECTRIC CAPACITOR TEST STRUCTURE FOR CHIP DIE

[75] Inventor: David E. Fisch, Sunnyvale, Calif.

[73] Assignee: National Semiconductor Corporation, Santa Clara, Calif.

[21] Appl. No.: 869,825

[22] Filed: Apr. 15, 1992

Related U.S. Application Data

[63] Continuation of Ser. No. 510,171, Apr. 16, 1990, abandoned.

[51] Int. Cl.$^5$ .............. G01R 31/26; H01L 21/66
[52] U.S. Cl. ...................... 437/8; 437/60; 437/170; 437/919
[58] Field of Search ................ 437/8; 365/144

[56] References Cited

U.S. PATENT DOCUMENTS

| | | | |
|---|---|---|---|
| 4,259,728 | 3/1981 | Geary et al. | 365/145 |
| 4,319,355 | 3/1982 | Mollier | 371/21 |
| 4,419,747 | 12/1983 | Jordan | 365/201 |
| 4,437,229 | 3/1984 | Bitler et al. | 437/8 |
| 4,451,903 | 5/1984 | Jordan | 365/94 |
| 4,532,607 | 7/1985 | Uchida | 365/96 |
| 4,550,289 | 10/1985 | Kabashima et al. | 324/158 R |
| 4,800,418 | 1/1989 | Natsui | 357/68 |
| 4,809,225 | 2/1989 | Dimmler et al. | 365/145 |
| 4,853,893 | 8/1989 | Eaton, Jr. et al. | 365/145 |
| 4,873,664 | 10/1989 | Eaton, Jr. | 365/145 |
| 4,972,372 | 11/1990 | Ueno | 365/201 |
| 5,038,323 | 8/1991 | Schwee | 365/189.01 |
| 5,046,043 | 9/1991 | Miller et al. | 365/145 |
| 5,060,191 | 10/1991 | Wagasaki et al. | 365/145 |
| 5,072,417 | 12/1991 | Aton et al. | 365/579 |

FOREIGN PATENT DOCUMENTS

| | | | |
|---|---|---|---|
| 0244435 | 4/1987 | Fed. Rep. of Germany | 365/201 |
| 1179375 | 9/1985 | U.S.S.R. | 365/201 |

OTHER PUBLICATIONS

VLSI On-Chip Test as a Lower Tier of Built-in Test, Frank J. Langley, Proceedings ATE West, 1985.
Requirements and Interim Solutions for High-Speed Testing of GaAs ICs, Tushar R. Gheewala, IEEE GaAs IC Symposium, 1985.
Survey of High Speed Test Techniques, Tushar Gheewala, SPIE vol. 795 Characterization of Very High Speed Semiconductor Devices & Integrated Circuits, 1987.
(untitled) IEEE Journal of Solid-State Circuits, vol. SC-18, No. 5, Oct., 1980.
Haist et al., IBM Technical Disclosure Bulletin, V. 19, No. 3 (Aug. 1976), p. 964.

Primary Examiner—Olik Chaudhuri
Assistant Examiner—H. Jey Tsai
Attorney, Agent, or Firm—Richards, Medlock & Andrews

[57] ABSTRACT

A test structure integrated into substantially each circuit die formed on a wafer. The test structure includes a ferroelectric component connected to bond pads of the die so that analog tests can be conducted thereon, and the results of the tests utilized to extrapolate aging and fatigue characteristics of other ferroelectric components in the functional circuits of the die. The ferroelectric test structure can be connected directly to die bond pads, or switchably connected thereto by decoding circuits which share bond pads employed by the other functional circuits of the die.

27 Claims, 3 Drawing Sheets

FERROELECTRIC CAPACITOR TEST STRUCTURE FOR CHIP DIE

RELATED APPLICATION

This is a continuation of U.S. patent application Ser. No. 07/510,171 filed Apr. 16, 1990, now abandoned.

TECHNICAL FIELD OF THE INVENTION

The present invention relates in general to integrated circuit wafer test circuits, and more particularly to ferroelectric capacitor test structures utilized at the wafer level, the die level and the packaged device level.

BACKGROUND OF THE INVENTION

The fabrication of integrated circuits on semiconductor wafers is a well known but complicated process. A semiconductor wafer, such as made of silicon, undergoes many process steps in order to achieve active and passive circuit elements having predefined electrical characteristics. By and large, the electrical characteristics of the integrated circuit components are a function of parameters such as processing time, chemical composition, temperature, pressure etc., all of which can be purposefully varied to achieve different electrical operating characteristics. On the other hand, process variables can change unintentionally during wafer processing, thereby altering the electrical circuit parameters, often in an undesired manner.

In order to ascertain variations of electrical circuit characteristics at different locations on the semiconductor wafer, as a function of process variables, it is a well known technique to form test cells or test structures at different locations on the wafer. Typically, a wafer is processed to produce a large number of identical circuits, each termed "die." In addition, one or more die locations can be replaced by the test cells so that after processing is complete, the test cells can be tested to determine the variance in electrical characteristics. By noting the variations in electrical characteristics over the surface of the wafer, it can then be determined what process variations occurred so that remedial action can be taken.

After wafer processing has been completed, and before separating the wafer into the individual die, the wafer generally undergoes sample testing of various die locations to determine the statistical probability that a majority of the circuits are operable. The wafer is then cut into the individual die, which die are connected to a lead frame and encapsulated to produce a packaged device. At the packaged level, each device is completely tested to assure that its electrical operation comports with predefined specifications.

Heretofore, the results of testing the test cells were utilized to maintain accurate control over the various processing variables. The actual test of the circuit die is generally carried out on a go, no-go basis. With such test circuits and procedures, it was difficult, if not impossible, to conduct tests to determine long term reliability of the circuits.

In the field of ferroelectric components, such as capacitors, there are electrical parameters which do not generally have counterparts in conventional integrated circuit analog and digital circuits. For example, ferroelectric materials can exhibit a fatigue parameter and an aging parameter which limit the useful life of such components. Ferroelectric materials commonly employed in fabricating ferroelectric type capacitors exhibit a capacitance, as well as a hysteresis characteristic. A ferroelectric capacitor can be polarized by the application of an electric field thereacross in one direction, and polarized in a different state with an opposite electric field. As the number of polarization state changes increase over the life of the capacitor, the remanent polarization thereof tends to degrade. This is termed ferroelectric capacitor "fatigue." In addition, while a ferroelectric capacitor can store a polarized state in a nonvolatile manner over a long period of time, the remanent polarization tends to decrease with time and is therefore susceptible to "aging."

From the foregoing, it can be seen that a need exists for a test structure for use with ferroelectric components to ascertain characteristics unique to such type of components. Another need exists for a ferroelectric test structure whose parameters can be determined at the wafer level, the die level as well as the packaged device level.

SUMMARY OF THE INVENTION

In accordance with the present invention, the test structure and corresponding method disclosed herein substantially reduce or eliminate the disadvantages and shortcomings associated with the prior art techniques. According to the invention, each circuit die fabricated within a wafer contains one or more ferroelectric test structures. The technical advantage of such a structure is that by carrying out tests on the test structure of each die, the processing variance over the entire wafer can be precisely determined. In addition, any circuit die can be tested at the die level, as well as when the die is packaged at the device level.

In accordance with the invention, the test structure comprises at least one ferroelectric capacitor which is fabricated by the same process steps as the ferroelectric components of the other die circuitry. The ferroelectric test structure is electrically accessible via the bond pads of the circuit die to carry out analog tests of the capacitor parameters, and thus postulate therefrom the various parameters of the other ferroelectric components forming the other functional circuitry of the die. According to one embodiment of the invention, a test ferroelectric capacitor is connected between a ground or common bond pad of the die, and an additional test bond pad. Various analog tests can be conducted directly on the capacitor to determine parameters such as fatigue and aging.

In accordance with another embodiment of the invention, a test ferroelectric capacitor is fabricated on the die and accessed via a test transistor. The test transistor and ferroelectric capacitor are connected between a common bond pad and test bond pad, as well as to another bond pad commonly used by the other die circuitry.

In yet other embodiments of the invention, a test ferroelectric capacitor is accessed via the die bond pads by which the other die circuitry is accessed, but by utilizing a particular digital code or combination not generally used when exercising the other die circuitry.

A primary technical advantage of the invention is that the ferroelectric test structure can be accessed at any level to conduct analog tests thereon, as well as tests to determine fatigue and aging characteristics of all of the ferroelectric components on the circuit die.

BRIEF DESCRIPTION OF THE DRAWINGS

Further features and advantages will become apparent from the following and more particular description of the preferred and other embodiments of the invention, as illustrated in the accompanying drawings in which like reference characters generally refer to the same parts, elements or functions throughout the views, and in which.

DETAILED DESCRIPTION OF THE INVENTION

Figures 1A, 1B, 1C:
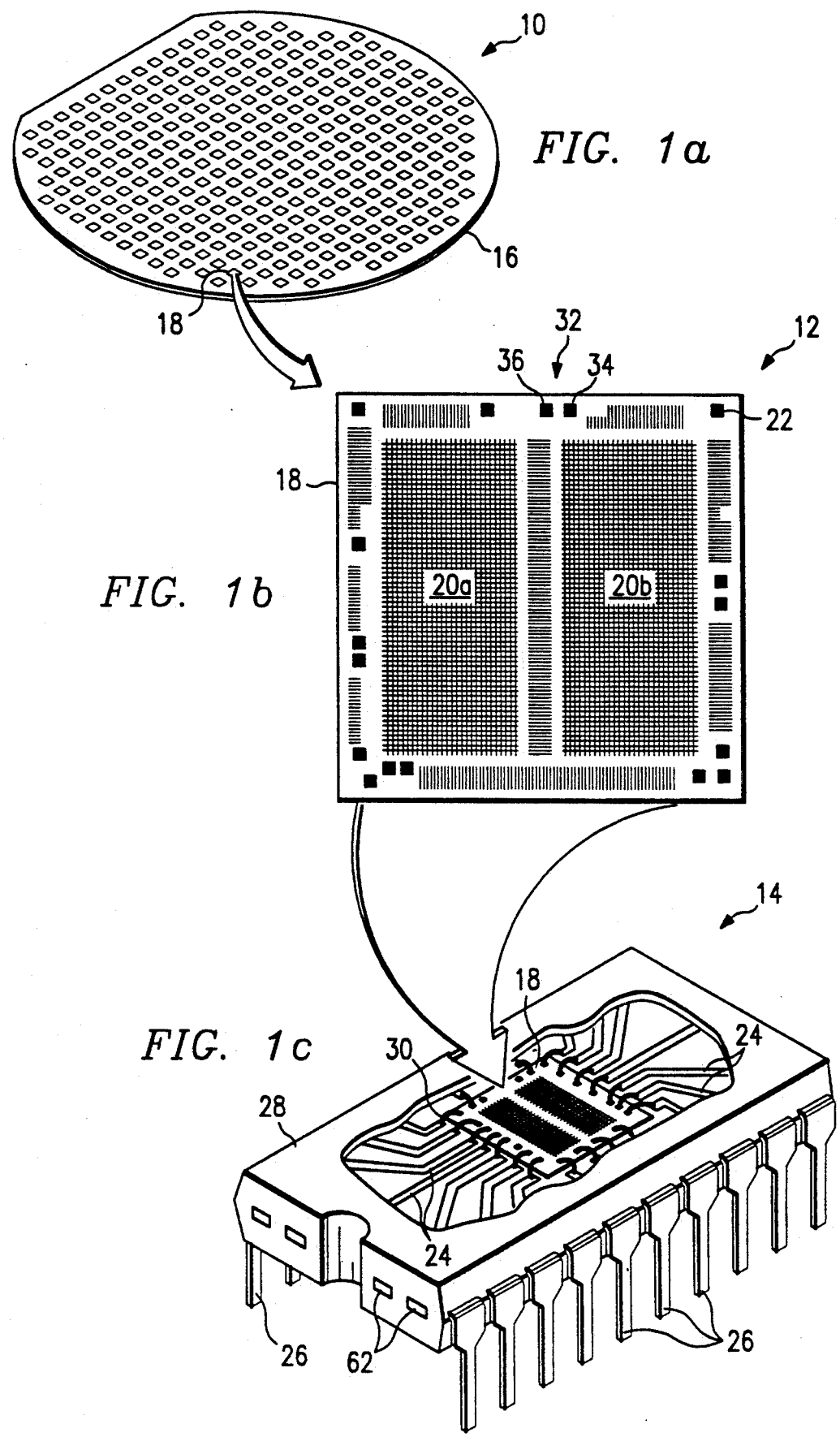
FIGS. 1a, 1b, 1c depict a circuit die in various sequences of processing, including the wafer level, the die level and the device level.

FIG. 1 illustrates the basic sequential fabrication steps which an integrated circuit chip undergoes from the wafer level to the device level. The principles and concepts of the invention can be employed at the wafer level 10, the die level 12, or the packaged device level 14. With respect to the wafer level 10, there is illustrated a semiconductor wafer 16 forming a base or substrate on which a plurality of circuit die 18 are fabricated. The processing steps for fabricating circuits on the die are conventional to semiconductor integrated circuits. Six-inch silicon wafers 16 are commonly utilized for fabricating hundreds of circuit die 18. Generally, each circuit die 18 on a wafer is of the identical circuit design, although the characteristics of the circuits may vary somewhat, depending upon the particular die location on the wafer 16. As noted above, the variations in electrical parameters of the various circuit die 18 can vary, sometimes significantly, because not all areas of the wafer are subjected to exactly the same processing parameters, such as temperature, pressure, etc.

In accordance with an important feature of the invention, a test structure is fabricated in each die 18 of the wafer 16 By testing the test structures and gathering data concerning the electrical parameters, a large data base can be obtained having statistically valid data over the entire wafer surface. Processing anomalies and differences can thus be detected, and the process parameters or equipment itself can be altered to optimize circuit performance and to make uniform the electrical characteristics of the circuits fabricated in each die 18. Each wafer 16 may not require comprehensive testing of all of the test structures on each die, but rather a sampling of wafers may result in the formation of a data base representing valid data of an entire batch of wafers.

The invention can be incorporated into wafers 16 of different sizes. Six-inch semiconductor wafers are commercially available for fabricating hundreds and even thousands of circuit die 18 thereon. The number of circuit die 18 which can be fabricated on a wafer 16 depends on the area of the die. For example, a circuit die 18 of 108 mils by 132 mils provides sufficient silicon area to fabricate 4K of static latch memory elements, in addition to the access circuitry. About 1500–1600 of such circuit die can be fabricated in a six-inch silicon wafer. The die size for 64K, 1M, etc. memory arrays may be larger, and therefore fewer such dies can be formed on a wafer.

The die 18 shown in FIG. 1 is exemplary of semiconductor memory circuits having a split bit line and corresponding memory arrays 20a and 20b. Access circuitry is formed therearound for reading and writing selected cells in the arrays 20a and 20b. In the example, the memory arrays 20a and 20b and the access circuitry comprise the functional circuitry of the die 18. As noted, a substantial area is required for providing electrical connections to the circuit die 18. Specifically shown are a number of metallized bond pads, such as 22, to which other conductors are externally bonded to connect the bond pads 22 to other circuits, such as a lead frame 24, comprising a part of the package for the circuit die 18. As further noted in FIG. 1, the lead frame 24 is spider-shaped and includes a number of conductors which terminate in respective terminals 26 of the packaged device 14. The terminals 26 of the packaged device 14 can be soldered or otherwise mechanically inserted into sockets for electrically interconnecting a number of such package devices together to provide overall system functions. The lead frame 24 is generally encapsulated with a plastic or ceramic insulator 28, as is the circuit die 18, to provide environmental and mechanical protection thereto. As noted, the bond pads of the die 18 are connected to the lead frame 24 by corresponding wire conductors 30.

The bond pads 22 of each circuit die 18 are fabricated by depositing a metallic conductor over the surface of the die 18, and etching the same in a pattern to define the shape and routing thereof. The bond pads 22 are thus connected to the various semiconductor elements for carrying electrical signals thereto, or therefrom. As can be appreciated, the bond pads 22 require substantial die area as compared to the semiconductor circuit elements themselves. Hence, no more bond pads are generally provided than necessary to provide electrical access to the circuits of the die 18.

There is always a constant endeavor to increase the circuit density per unit of die area and thereby enable a greater number of circuit die 18 to be fabricated on a wafer 16 of a given size. Accordingly, the provision of bond pads 22 which are not absolutely required for the operation of the circuit represents a compromise in the size of the circuits and thus the number of such die which can be fabricated on the wafer 16. Although the fabrication of test structures on a die 18 requires some silicon area, the area is significantly less than that required to form bond pads 22. In any event, test structures are preferably fabricated on die areas where the routing of conductors is convenient, thus facilitating the design of mask.

Figure 2:
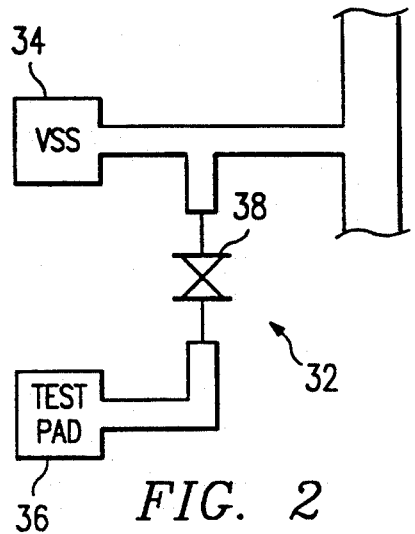
FIG. 2 illustrates the connection of a test ferroelectric capacitor structure between two bond pads of a circuit die.

In accordance with another important feature, the test structure of the invention is fabricated on the die 18 so as to minimize the requirement of additional bond pads. The area 32 of the die 18 illustrates the location of a test structure associated with bond pads 34 and 36. FIG. 2 illustrates the test structure in more detail. The test structure according to this embodiment comprises a ferroelectric capacitor 38 connected between a pair of bond pads 34 and 36.. Preferably, the test structure 38 is connected to bond pads which are also utilized with respect to the other functional circuits on the die 18. To that end, the ferroelectric test structure 38 is connected to a ground or $V_{SS}$ bond pad which provides a common or ground connection to the various circuit elements on the die 18. While the $V_{SS}$ bond pad is shown as one possibility for connection to the ferroelectric capacitor test structure 38, a $V_{CC}$ or other power carrying bond pad could be employed as well. The other terminal of the ferroelectric capacitor test structure 38 is connected to a test pad 36, dedicated for test purposes. The test bond pad 36 and associated conductor can be fabricated during the conventional metalization process employed to interconnect the circuit components of the functional circuitry on the die 18.

Preferably, the ferroelectric capacitor test structure 38 is fabricated by the same process steps as the ferroelectric capacitors utilized in forming the non-volatile memory arrays 20a and 20b. The particular fabrication techniques employed in forming ferroelectric components is described in more detail in U.S. Pat. No. 4,759,823, the disclosure of which is incorporated herein by reference. Moreover, the fabrication of non-volatile ferroelectric capacitor cells is well documented in the art.

Figure 3:
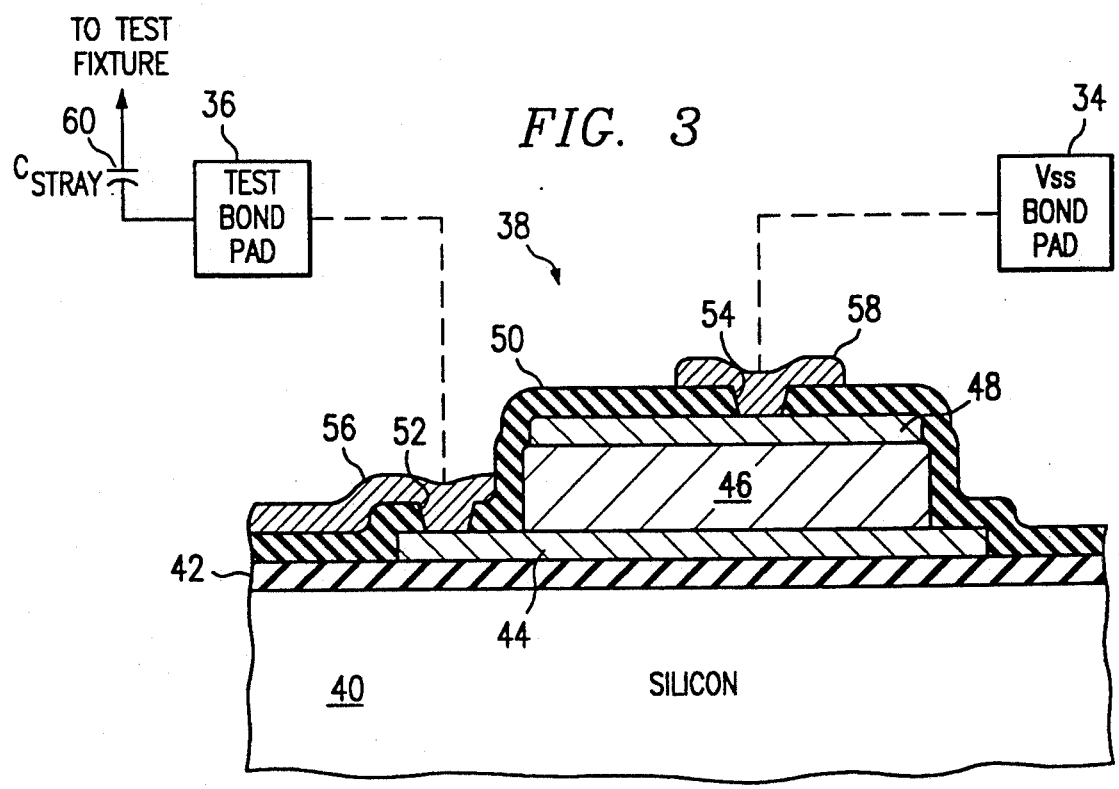
FIG. 3 is a cross-sectional view of a semiconductor wafer having fabricated therein a ferroelectric test capacitor of the invention.

FIG. 3 is a sectional view of the ferroelectric capacitor test structure 38 of the invention connected between the bond pads 34 and 36. The ferroelectric capacitor 38 is fabricated on the substrate material in which the other functional circuits of the die 18 are formed. A silicon substrate 40 is shown as one example of a base upon which the ferroelectric capacitor 38 can be fabricated. The fabrication of a ferroelectric capacitor test structure 38 can be carried out by utilizing conventional silicon processing equipment and techniques. A layer of silicon dioxide 42 is formed on the surface of the silicon substrate 40. Such layer 42 electrically isolates the capacitor 38 from the substrate 40. The thickness of the silicon dioxide 42 is not critical, but is sufficient to isolate the ferroelectric capacitor 38 from the silicon substrate 40 when the appropriate voltages are applied thereto. Preferably, the silicon dioxide 42 is of sufficient thickness to provide ample voltage breakdown characteristics between the ferroelectric capacitor and the substrate. Deposited and patterned on the surface of the silicon dioxide 42 is a conductive material defining the bottom plate 44 of the ferroelectric capacitor 38. Platinum is preferable for use as the bottom plate 44 of the capacitor 38. However, other conductive materials and metals can be utilized with adequate effectiveness.

Next, a ferroelectric dielectric layer 46 is deposited and patterned on the bottom conductor plate 44. A PLZT type of ferroelectric material is ideally suited for use with ferroelectric capacitors. Preferably, the ferroelectric layer 46 is deposited or spun on the wafer 16 to a depth in the range of about 500 angstroms to 0.4 microns. The ferroelectric layer 46 is patterned to form an area sufficient to achieve a desired capacitance. The test capacitor structure 38 is fabricated having a capacitance larger than the ferroelectric capacitors defining the memory arrays 20a and 20b. By fabricating a larger ferroelectric capacitor test structure 38, the testing thereof to ascertain electrical characteristics and parameters is facilitated and is not substantially affected by undesired parasitic capacitances. Importantly, the capacitor test structure 38 is fabricated so as to exhibit a capacitance with respect to circuit stray capacitance, or an externally connected test capacitance, which yields a ratio substantially equal to the ratio of the cell ferroelectric capacitance of the array 20 and the bit line capacitance. It is well known that for the proper read and write operations of ferroelectric capacitor cells, the respective bit lines are required to exhibit some minimal capacitance.

By utilizing a PLZT type of ferroelectric material, and fabricating the ferroelectric dielectric material with a thickness of about 0.4 microns, a capacitor area of about 5 microns by 5 microns operating at 5 volt potentials produces a capacitance between about 0.3 and 1.2 picofarad. Other processing techniques for fabricating ferroelectric capacitors will yield different capacitances per unit area. Accordingly, the size of the capacitor test structure 38 can be adjusted to define a capacitance so as to satisfy the following expression:

$$\frac{C_{TS}}{C_{STRAY}} = \frac{C_{CELL}}{C_{BL}}$$

Where $C_{TS}$ = the capacitance of the test structure,
$C_{STRAY}$ = the test capacitance or stray test lead capacitance, or external test capacitance,
$C_{CELL}$ = the ferroelectric capacitance of the cells in the arrays, and
$C_{BL}$ = the capacitance associated with the bit lines of the cell arrays.

In a typical non-volatile memory cell, the ferroelectric cell capacitance is about 0.6 picofarad, while the bit line capacitance is about 1.2 picofarad. The ratio thereof is then about one half. It should be realized that in actuality these memory capacitances are in series, as should be the capacitance of the test structure 38 and the test capacitor or parasitic capacitance associated therewith. Nevertheless, the ferroelectric capacitor test structure 38 should be fabricated such that the ratio of the capacitance thereof with respect to the test capacitor or stray capacitance is substantially equal to the ratio defined above. By maintaining a substantially equal ratio, the results of tests conducted on the test structure 38 will be indicative of the actual electrical characteristics of the cell capacitors of the ferroelectric arrays 20a and 20b.

With reference back to the fabrication of the ferroelectric capacitor 38 shown in FIG. 3, a conductive layer 48, defining a top capacitor plate, is deposited and patterned on top of the ferroelectric dielectric layer 46. Again, the conductor 48 can be platinum or other suitable conductor. A passivation layer 50 of silicon dioxide, or other suitable passivating material, is deposited over the surface of the wafer and patterned to define openings to the various conductors. Particularly, an opening 52 is formed in the passivating layer 50 for providing access to the bottom capacitor plate 44. An opening 54 is formed in the passivating layer 50 for providing access to the top capacitor plate 48. Yet another conductive layer is deposited over the surface of the wafer and patterned to define a conductor 56 for connecting the bottom capacitor plate 44 to the test bond pad 36. In like manner, a conductor 58 is patterned to connect the top capacitor plate 48 to another bond pad, shown as the $V_{SS}$ bond pad 34. Digital and/or analog access to the ferroelectric test capacitor 38 can thus be had via the bond pads 34 and 36.

A significant technical advantage presented by the invention is that the capacitor test structure 38 can be easily accessed to conduct numerous analog tests thereon to determine the electrical characteristics thereof. This is especially advantageous over prior test structures when analog degradation of a digital component cannot be easily ascertained. However, according to the invention, the ferroelectric capacitor test structure 38 can be subjected to both analog and digital tests to determine characteristics, such as aging, fatigue, etc. As noted in FIG. 3, an optional physical test capacitor $C_{STRAY}$ is connected in series between the test bond pad 36 and the test fixture (not shown). In the event there are sufficient parasitic capacitances, the physical capacitor 60 may be eliminated. Of course, the test fixture is also connected to the $V_{SS}$ bond pad 34 so that the capacitor test structure 38 is in series between the bond pads. As noted above, the stray or physical capacitance 60 in series between the capacitor test structure 38 and the test fixture should be of such a magnitude with respect to the capacitance of the ferroelectric capacitor test structure 38 to satisfy the equation above. The noted capacitance ratio is primarily for ease of testing, although such ratio is not absolutely necessary to extract useful information from the test structure. For example, if the capacitance of the test structure 38 is 100 picofarad, then the stray capacitance 60 should be about 200 picofarad to realize the ratio of one half.

By making the capacitor test structure 38 available for testing via die bond pads, such capacitor can be tested at the wafer level by probing the appropriate bond pads 34 and 36 of each die and conducting tests thereon. Further, the test bond pad 36 can be connected during packaging to a spare terminal 26, if any, of the packaged device 14, or to an external test node such as shown by reference character 62. The test node 62 comprises a part of the lead frame 24 connectable by bonding wires 30 to the test pad 36 of the die 18. External test nodes 62 of the package device 24 have been previously utilized by those skilled in the art to adjust the substrate bias of packaged integrated circuits.

Analog testing can also be carried out on the capacitor test structure 38 by utilizing a capacitance-voltage meter. Such tests would be carried out by driving the capacitor test structure 38 with a linear ramp current, and observing the resulting voltage thereacross. The slope of the resulting voltage signal denotes the capacitance parameter. The capacitance-voltage meter can also be employed to test the small signal response of the capacitor test structure 38. In addition, when the polarization state of the capacitor changes or switches, the resulting electrical characteristics thereof can also be observed. By switching the ferroelectric test capacitor 38 from one state to the other, hysteresis characteristics thereof can be observed and the associated quality of the capacitor can be determined. Of course, other digital impulse tests can be conducted on the capacitor test structure.

Whether at the wafer level 10 or at the packaged device level 14, the capacitor test structure 38 can be tested to simulate aging and fatigue characteristics. Moreover, defective devices returned from field use, or recovered from circuit boards, can be subsequently tested to interpolate or postulate the quality of the other ferroelectric capacitors comprising the nonvolatile memory arrays 20a and 20b.

Ferroelectric capacitors generally exhibit the undesirable characteristics of aging and fatigue. Particularly, a ferroelectric component "ages", in that the quality of the stored polarization state degrades over a period of time. A ferroelectric capacitor also exhibits a "fatigue" factor, in which the quality of the polarization state capable of being stored degrades as a function of the number of times the polarization of the capacitor is changed. In other words, a ferroelectric capacitor that undergoes numerous polarization changes has a shortened lifetime.

The aging factor of a ferroelectric capacitor can be simulated by driving it in a pulsed manner so as to alternately switch the polarization states a large number of times, such as one million times. Then, the magnitude of a remanent polarization is determined and identified as a reference value. A predefined time period layer, such as 10 milliseconds, and the remanent polarization magnitude is determined. Such tests are conducted at logarithmic time periods, such as 10 milliseconds, 100 milliseconds and one second. The polarization state is known to decay as a function of the logarithm of time. By conducting the foregoing "aging" tests, aging parameters of the ferroelectric test capacitor structure 38 can be determined. In addition, such test results can be extrapolated to ascertain the aging characteristics of the ferroelectric capacitors comprising the non-volatile memory arrays 20a and 20b.

The fatigue characteristic of a ferroelectric capacitor is measured by first measuring the remanent polarization voltage, and then switching the polarization state a number of times, such as one million, and thereafter measuring the remanent polarization voltage. The frequency and duty cycle of the pulse string by which the ferroelectric capacitor structure 38 is switched is arbitrary. In practice, the ferroelectric test capacitor 38 is switched with a one hundred Khz signal of 50% duty cycle. The decay in the remanent polarization voltage after such number of cycles is a measure of the fatigue of the ferroelectric capacitor.

Other dynamic tests can be conducted on the capacitor test structure 38, including depolarization factors and retention measurements, all well known in the art.

Figure 4:
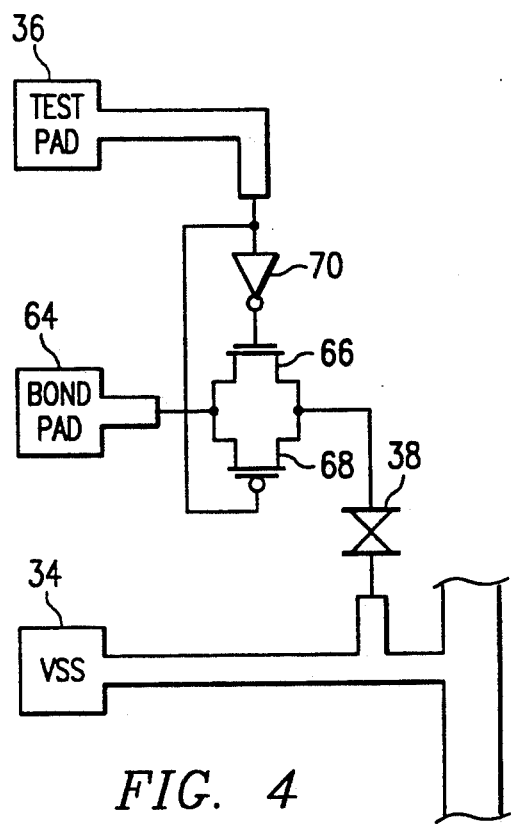
FIG. 4 illustrates a ferroelectric capacitor test structure and a circuit for switching the capacitor for testing between bond pads of the circuit die.

With reference now to FIG. 4, there is illustrated a capacitor test structure 38 switchably connected to bond pads of the circuit die 18. Switching the capacitor test structure 38 is carried out by an N-channel transistor 66, a P-channel transistor 68 and an inverter 70. Such switching components can be conveniently fabricated in the silicon of the circuit die 18. With such a switching configuration, the source terminals of the transistors 66 and 68 are connected together and to one plate of the test capacitor structure 38. The drain terminals of the transistors 66 and 68 are also connected together and to a bond pad 64. The bond pad 64 can be dedicated to test purposes, or used in conjunction with the operation of the other functional circuits of the die 18. The input to the switching arrangement is via the test pad 36 which is connected to the gate terminal of the P-channel transistor 68, and through the inverter 70 to the gate terminal of the N-channel transistor 66.

In operation, a logic high voltage applied to the test pad 36 maintains the transistors 66 and 68 in a nonconductive state, and thus the test capacitor structure 38 is isolated. When a logic high voltage is applied to the test pad 36, transistors 66 and 68 and driven into a conductive state, thereby connecting the test capacitor 38 between the bond pads 34 and 64. When the transistors 66 and 68 are driven into a conductive state, digital or analog tests can be carried out on the ferroelectric test capacitor 38. The back-to-back connection of the transistors 66 and 68 allows the full range of supply or signal voltages to be applied therethrough to the capacitor test structure 38. In other words, voltages close to $V_{CC}$ and $V_{SS}$ can be applied directly across the capacitor test structure 38. Without such a switching transistor connection, the threshold voltages of such transistors would prevent a full application of voltages to be applied across the capacitor test structure 38. Notwithstanding, it may be desirable to employ a single transistor for switchably connecting the capacitor test structure 38 between the bond pads 34 and 64.

Figure 5:
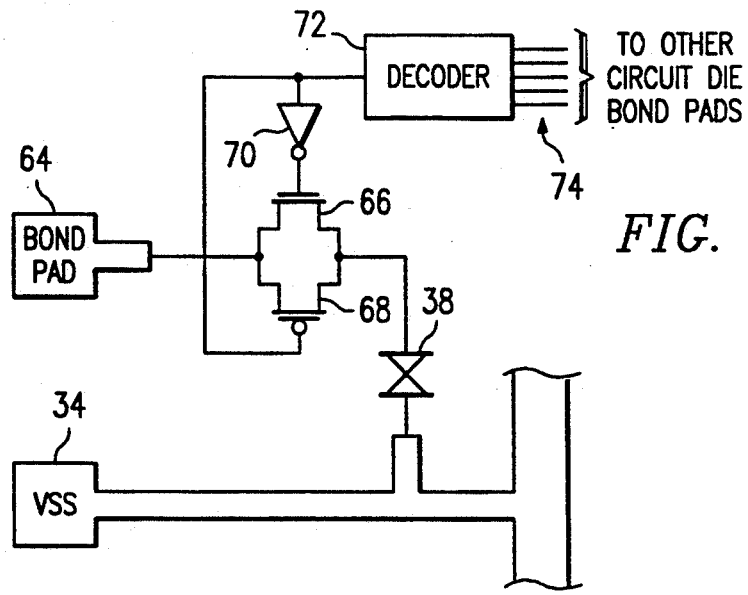
FIG. 5 is a test circuit responsive to a predefined digital code input to the circuit die for switchably connecting the ferroelectric test capacitor between bond pads of the die.

FIG. 5 illustrates another embodiment of a test structure according to the invention. This embodiment is similar to that described above in connection with FIG. 4, but requires one less dedicated bond pad. Rather than driving the transistor pair 66 and 68 from a separate test bond pad, such transistors are driven by a decoder 72. The decoder 72 is responsive to a unique combination of signals on inputs 74 to provide an output logical low signal for driving the transistor pair 66 and 68 into conduction. Otherwise, the output of the decoder 72 is a logic high which isolates the ferroelectric capacitor structure 38. The decoder 72 can be integrated into the silicon material of the die 18, utilizing conventional decoding circuits and theory. The inputs 74 of the decoder 72 are preferably connected to other decoded signals, or other inputs of the circuit die 18. For example, the decoder inputs 74 can be connected to other circuit die bond pads which are typically employed for exercising the memory arrays 20a and 20b. Address, data, R/W or chip enable inputs of the circuit die 18 can be utilized as the decoder inputs 74. Preferably, a unique combination of such inputs are provided to the decoder 72, which combination is not otherwise used in operating the other functional circuitry of the circuit die 18.

Those skilled in the art can readily incorporate the switching transistor arrangement and decoder circuits 72 for integration with the test capacitor structure 38 shown in FIG. 3.

Figure 6:
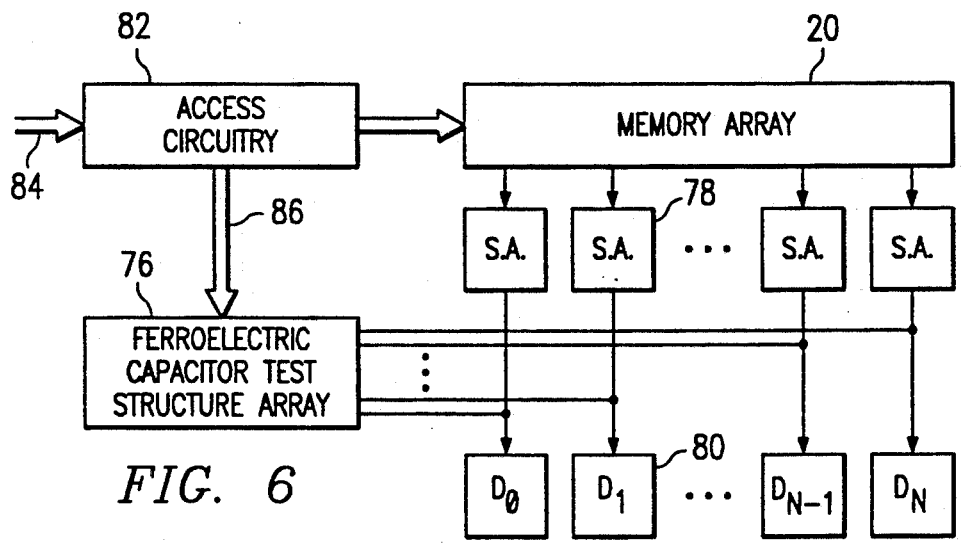
FIG. 6 is a circuit diagram of a memory incorporating an array of ferroelectric capacitor test structures.

Yet another embodiment of the invention is depicted in FIG. 6. With this arrangement, no additional die bond pads are required in order to provide access to the ferroelectric capacitor test structures, shown as an array 76. Each cell of the test array 76 can comprise a ferroelectric capacitor, or such a capacitor in series with an access transistor. The ferroelectric capacitor test structures comprising the array 76 are preferably fabricated on the silicon die 18, and structured to store manufacturer or test data, not otherwise available to general users of the packaged device 14. The array 76 can be structured similar to conventional ferroelectric memory arrays having rows and columns and drive lines, word lines, and bit lines for reading and writing capacitor storage elements to change the polarization states for storing data therein. It is envisioned that the die circuit would include a typical memory array 20 and associated sense amplifiers 78. The output of the sense amplifiers 78 comprise logic signals which are coupled to data bond pads 80. The memory array 20 is accessed by circuitry 82 for selectively reading and writing desired storage locations. The access circuitry has inputs 84 comprising address, R/W, chip enable, etc. inputs generally utilized in accessing random access memories. Other conventional I/O terminals are not shown in the memory device of FIG. 6.

In accordance with the invention, the access circuitry 82 also has an output 86 coupled to the ferroelectric capacitor test structure array 76. The data terminals 80 are the input/output type in which data can be entered into the memory array 20 or into the test structure array 76, or read therefrom. According to an important feature of the invention, the test structure array 76 can be factory programmed to store in the non-volatile ferroelectric cells such information as the lot number of the wafer or die, the run number, the geographical fabrication location, the wafer number, and even the die number on the wafer. Of course, other similar information can be stored in the test structure array 76. As can be appreciated, during diagnosis of a returned packaged device 14, the test structure array 76 can be accessed to determine historical aspects of the circuit. With such information, a statistical data base can be generated so that chip failures or anomalies can be correlated to the information stored within the array 76.

The test structure array 76 is preferably accessible by a unique code which is not otherwise useable in accessing the memory array 20. Those skilled in the art can appreciate that certain deciphering techniques can be employed to assure that the test structure array 76 cannot be accessed during the general operation of the memory array 20, but rather can be only accessed by those knowing the unique access code. Where it is only necessary to read and write information into the test structure array 76, such array can be incorporated as a portion of the memory array 20. In this instance, the test structure array would be dedicated to storing the manufacturer information noted above, and would not be available to users of the device. It is contemplated that preferably the test structure array 76 is a separate array in which the ferroelectric cells can store the manufacturer information noted above, and can also be dynamically tested under various analog conditions to determine aging, fatigue, etc. characteristics thereof. In such a configuration, the test structure array 76 would be first read so that the manufacturer information can be stored externally and used for diagnostic purposes and evaluation. Then, the ferroelectric capacitor elements themselves can be tested to determine aging and fatigue factors as well as other parameters. If need be, and after diagnostic testing, the test structure array 76 can be written with the externally stored original manufacturer information and recalled at yet a later time.

Figure 7:
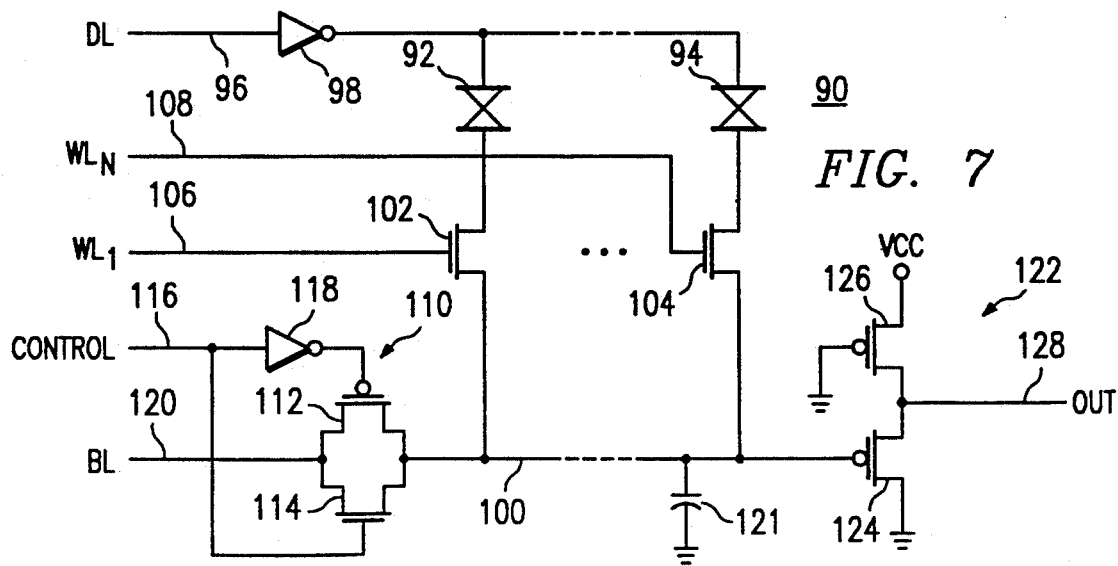
FIG. 7 is a detailed schematic diagram of an exemplary test structure array.

FIG. 7 illustrates a small portion of the test structure array 90, especially adapted for storing data, as well as being accessible to the circuit die bond pads for analog testing. The array 90 illustrates two ferroelectric test structures 92 and 94, although many other such structures could be fabricated in an array. The test structure array 90 includes a drive line 96 for driving one plate of the ferroelectric test structures 92-94, via an inverter 98. While one inverter 98 is shown for driving all of the test structures, a single inverter could be associated with each ferroelectric test structure 92-94.

The array 90 further includes a bit line 100 to which the ferroelectric test structures 92-94 are connected by way of corresponding N-channel transistors 102-104. Respective word lines 106 and 108 are connected to the respective transistors 102 and 104 for connecting the ferroelectric test structures 92-94 to the bit line 100. By providing a word line for each transistor 102-104, the ferroelectric test structures 92-94 can be individually connected to the bit line 100. The bit line 100 is accessible externally by a pass gate arrangement 110 comprising a P-channel transistor 112 having source and drain terminals connected in parallel with an N-channel transistor 114. A control input 116 is connected through an inverter 118 to the gate of the P-channel transistor 112, and is connected directly to the gate of the N-channel transistor 114. Thus, when the control input 116 is driven to a logic high level, both pass gate transistors 112 and 114 are driven into a conductive state, thereby connecting the input bit line 120 to the internal bit line 100. The pass gate arrangement 110 is effective to couple large amplitude signals from the input bit line 120 to the internal bit line 100 so that the ferroelectric test structures 92-94 can be written with a desired polarization states. A capacitor may be connected between the internal bit line 100 and ground to provide a series capacitance to the ferroelectric test structures 92-94. The capacitor may be fabricated in the circuit die, or can comprise the parasitic capacitance associated with the internal bit line 100.

At its output end, the internal bit line 100 is connected to a source follower transistor arrangement 122. The source follower 122 includes a pair of series-connected P-channel transistors 124 and 126. Transistor 124 has its gate input connected to the internal bit line 100, and a drain terminal which is grounded. The source terminal of the transistor 124 is connected to a drain terminal of the transistor 126, such junction defining an output 128 of the test structure array 90. Further, P-channel transistor has a grounded gate terminal, and a drain terminal connected to a supply voltage $V_{CC}$. The source follower arrangement 122 facilitates the array readout when test equipment is connected to the output 128. The capacitance associated with test probes and equipment is generally larger than that of the ferroelectric test structures 92-94, and thus the direct connection of test equipment to the internal bit line 100 could partially or entirely destroy the readout signals from the array. The source follower arrangement 122 thus electrically isolates the internal bit line 100 from the test equipment connected to the output 128 so that the integrity of the signals on the bit line 100 can be maintained and coupled as such to the test equipment.

In operation, an individual ferroelectric test structure, such as 92, can be written by first driving the control input 116 to a logic high level and then applying a logic signal to the input bit line 120 to charge or discharge the bit line capacitor 121. Then, the drive line 96 is driven to a logic low level, thereby applying a logic high signal to the top plate of the ferroelectric test structures 92-94. The particular word line 106 is driven to a logic high level, thereby connecting the bottom plate of the ferroelectric test structure 92 to the internal bit line 100. Depending upon whether or not the bit line capacitor 121 is charged or discharged, the selected ferroelectric test structure 92 will be polarized in one state, or another state. Each individual test structure of the array can be written with a particular polarization state in a similar manner. Bit line signals connected to the output 128 during the write operations can be ignored.

In order to cycle the polarization state of one or more of the ferroelectric test structures 92-94, numerous write cycles can be carried out in which the internal bit line capacitor 121 is alternately charged and discharged to thereby write different polarization states into the selected ferroelectric test structure.

Importantly, signals of various amplitudes can be coupled to the internal bit line 100 to charge the bit line capacitor 121 to various voltages such that the ferroelectric test structures 92-94 can be written with polarization states having different amplitudes. Also, while the ferroelectric test structures 92-94 can be written with predefined and different polarization states, yet other readout signals can be achieved by charging the bit line capacitor 121 with various voltages during the readout cycle. During readout, the bit line capacitor 121 would again be charged to a predefined voltage, the drive line 96 would be driven to a low logic level, and the particular word line would be driven high to select the readout of a particular ferroelectric test structure. The readout can be obtained at the output 128, via the source follower arrangement 122. The output 128 will generally track the voltages presented on the internal bit line 100, although the relationship therebetween may have to be calibrated.

The individual ferroelectric test structures 92-94 are preferably capacitors capable of nonvolatile storage of data states. Since each structure 92-94 can be exercised independently of the others and the test results obtained externally, a new advantage can be obtained. For example, one test structure can be written with a predefined polarization state, and then an adjacent or neighbor test structure exercised once or many times. The one test structure can then be read to determine what effect, if any, the exercising of a neighbor test structure had on the one structure. The isolation and cross-coupling between test structures can thus be determined, again using analog signals, if necessary.

While the array 90 shown in FIG. 7 constitutes a single column of ferroelectric test structures, additional rows can be implemented by providing drive line decoding circuitry. Those skilled in the art having available the foregoing will be able to readily devise of a test structure having additional columns defining plural rows and columns of ferroelectric test structures. Again, the inputs and outputs to the array 90 can be accessed via dedicated bond pads, shared bond pads, or in certain instances, by plural decoded inputs.

From the foregoing, disclosed is a ferroelectric test structure which is accessible either at the wafer level, the die level or at the packaged device level. Analog tests can be conducted on the test structures to derive electrical parameter data for extrapolating the quality of other similar non-accessible ferroelectric components on the die. The ferroelectric test structure is connected either directly or switchably to bond pads of the circuit die for conducting analog tests thereon. In alternative embodiments, the ferroelectric test structure can be connected to bond pads usable by other functional circuitry of the die, and driven by decoding or other types of circuits using other inputs of the die not dedicated to testing. In accordance with the invention, the ferroelectric test structures are fabricated on each die of a wafer. In this manner, stepped die testing can be carried out on each die of the wafer to determine a go, no-go quality of the entire die circuitry, without testing all of the circuitry. In addition, by testing the ferroelectric test structure associated with each die without testing the entire functional circuitry of the die, the quality of the ferroelectric material can be ascertained and thus the circuit dies can be stored according to gradations of quality. Analog testing can be carried out on the ferroelectric test structures to determine the aging and fatigue parameters thereof, and thereby extrapolate such information as to the quality of the ferroelectric components associated with the other functional circuitry of the die.

While the preferred and other embodiments of the invention have been disclosed with reference to specific ferroelectric test structures and methods of fabrication and testing, it is to be understood that many changes in detail may be made as a matter of engineering choices without departing from the spirit and scope of the invention, and defined by the appended claims.

What is claimed is:

1. In a semiconductor wafer of the type having a plurality of circuit die, and at least some of the die having a ferroelectric component, a method of incorporating a test structure in the semiconductor wafer, comprising the steps of:

fabricating at least one ferroelectric test structure into each said die having ferroelectric component so that the test structure undergoes substantially the same processing environment as does functional circuitry of the die;

fabricating said ferroelectric test structure as a two-terminal device in series with a transistor switch for switchably connecting the ferroelectric component between bond pads; and connecting the ferroelectric test structure so that each terminal of the ferroelectric test structure is coupled to a different bond pad of the respective die for providing electrical access to the test structure by way of said bond pads and so that analog tests can be conducted thereon and analog signals resulting from said tests can be obtained from at least one of the bond pads.

2. The method of claim 1, further including connecting one said terminal of the ferroelectric component to a bond pad which carries a supply voltage to other functional circuitry of the die.

3. The method of claim 1, further including fabricating an array of non-volatile ferroelectric memory circuits in each said die, and bit lines common to plural memory cells of the array for providing a readout, and further including simulating a parasitic capacitance of the bit lines with a discrete capacitor for use in combination with the ferroelectric component to test electrical parameters of the ferroelectric test structure.

4. The method of claim 3, further including fabricating a circuit die with capacitors having the relationship:

$$\frac{C_{TS}}{C_{STRAY}} = \frac{C_{CELL}}{C_{BL}}$$

where $C_{TS}$ is the capacitance of a ferroelectric capacitor test structure, $C_{STRAY}$ is stray capacitance associated with the ferroelectric test structure, $C_{CELL}$ is the capacitance of a ferroelectric capacitor associated with one said cell, and $C_{BL}$ is a parasitic capacitance of the bit lines.

5. The method of claim 4, wherein $C_{TS}$ and $C_{STRAY}$ are electrically connected in series.

6. The method of claim 3, further including fabricating each said cell with a non-volatile storage capability of a ferroelectric capacitor.

7. The method of claim 1, further including fabricating the ferroelectric test structure using substantially the same process steps as other ferroelectric components of the die, and forming a capacitance of the test structure larger than that of similar ferroelectric components of the functional circuitry.

8. The method of claim 1, further including carrying out analog tests on the ferroelectric component to determine hysteresis characteristics of the ferroelectric test structure.

9. The method of claim 8, including fabricating a transistor for switchably connecting said ferroelectric test structure between said bond pads.

10. The method of claim 9, further including fabricating a decode circuit for decoding plural input signals for driving said transistor.

11. A method for fabricating a test structure into a circuit die, comprising the steps of:

fabricating in the die functional circuits embodying at least one ferroelectric component;

fabricating bond pads on said die, at least some pads of which are employed for accessing the functional circuitry of the die;

fabricating a test structure on the die including a ferroelectric component in series with a transistor, said ferroelectric component fabricated by substantially the same steps as utilized in fabricating the ferroelectric components of the functional circuitry; and connecting the ferroelectric test structure so that electrical access thereto can be had to at least one terminal of the ferroelectric component via a bond pad such that analog tests can be conducted thereon and analog signals from the ferroelectric component can be obtained via the bond pad to which the ferroelectric component is connected.

12. The method of claim 11, further including connecting the ferroelectric component of the test structure between a bond pad dedicated to test and a bond pad adapted for carrying power to the functional circuits of the die.

13. The method of claim 12, further including connecting a parallel arrangement of a P-channel and an N-channel transistor pair in series with the ferroelectric component of the test structure for switchably connecting said component to the bond pads and for allowing substantially a full range of a supply voltage to be received from the ferroelectric component.

14. The method of claim 11, further including connecting the circuit die to a lead frame and encapsulating the circuit die and a portion of the lead frame, and allowing external access to the test structure via said lead frame.

15. A circuit die, comprising:

a ferroelectric memory having a plurality of memory cells, each cell having at least one ferroelectric capacitor formed on a semiconductor material of said die, said ferroelectric memory storing data and defining a functional circuit, and being connected to a supply voltage;

a plurality of bond pads connected to the functional circuit for providing electrical access thereto;

a test structure having a ferroelectric component formed on said die, said test structure ferroelectric component undergoes substantially the same processing steps as utilized in fabricating the functional circuit ferroelectric memory cells; and said test structure being connected so that AC signals of amplitude equal to or less than said supply voltage can be applied to the bond pads and to the test structure, and said test structure is interconnected with respect to said ferroelectric memory so that analog tests can be conducted on said test structure without accessing the ferroelectric memory, and analog signals can be obtained from the test structures via ones of said bond pads.

16. The circuit die of claim 15, wherein said test structure includes a ferroelectric capacitor having a coercive voltage equal to or less than the supply voltage, and said ferroelectric capacitor is connected to the bond pads so that fatigue tests can be conducted thereon.

17. The circuit die of claim 15, wherein said ferroelectric component is connected directly to a pair of said bond pads.

18. The circuit die of claim 15, wherein said ferroelectric component is connected to a dedicated test bond pad and to a bond pad shared with the other functional circuit.

19. The circuit die of claim 15, wherein said ferroelectric component is switched to ones of said bond pads by a transistor.

20. The circuit die of claim 15, further including a plurality of substantially identical circuit die formed on a semiconductor wafer.

21. The circuit die of claim 15, further including a plurality of test structures, and access circuitry for independently accessing each test structure.

22. A test array formed on a semiconductor wafer, comprising:
an array of ferroelectric test structures, each test structure including a ferroelectric capacitor;
at least one bit line for coupling signals to said test structures;
an access transistor associated with each said test structure of independently connecting a respective ferroelectric capacitor to said bit line; and
an input structure to said bit line for carrying analog signals ranging in amplitude from about a supply voltage to about a ground reference voltage to said test structures for subjecting the test structures to different amplitudes of said analog signals.

23. The test array of claim 22, further including means for connecting said bit line as an output to off-wafer circuits.

24. The test array of claim 22, wherein said bit line is connected to a pass gate comprising a P-channel transistor and an N-channel transistor.

25. The test array of claim 22, further including a drive line for simultaneously driving each said test structure with a drive line signal.

26. The test array of claim 22, further including a capacitor other than parasitic capacitance and different from said ferroelectric capacitor connected to said bit line.

27. The test array of claim 23, wherein said bit line input and output are distinct from each other, where the bit line input is utilized only for applying external signals to the test structure, and the bit line output is utilized only for transferring signals resulting from tests on the test structure array therefrom.

* * * * *